United States Patent
Doerrer et al.

(10) Patent No.: US 7,453,381 B2
(45) Date of Patent: Nov. 18, 2008

(54) POWER-SAVING MULTIBIT DELTA-SIGMA CONVERTER

(75) Inventors: Lukas Doerrer, Villach (AT); Franz Kuttner, St. Ulrich (AT)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 10/590,401

(22) PCT Filed: Feb. 4, 2005

(86) PCT No.: PCT/EP2005/001165

§ 371 (c)(1),
(2), (4) Date: May 14, 2007

(87) PCT Pub. No.: WO2005/083888

PCT Pub. Date: Sep. 9, 2005

(65) Prior Publication Data

US 2007/0290907 A1    Dec. 20, 2007

(30) Foreign Application Priority Data

Feb. 27, 2004 (DE) ........................ 10 2004 009 609
Jun. 25, 2004 (DE) ........................ 10 2004 030 812

(51) Int. Cl.
*H03M 3/00* (2006.01)
(52) U.S. Cl. ........................... 341/143; 341/155
(58) Field of Classification Search .......... 341/143–155
See application file for complete search history.

(56) References Cited

U.S. PATENT DOCUMENTS 6,346,898 B1    2/2002  Melanson (Continued)

FOREIGN PATENT DOCUMENTS

DE    31 47 409    11/1981

(Continued)

OTHER PUBLICATIONS

German Office Action dated Feb. 22, 2005.

(Continued)

*Primary Examiner*—Lam T Mai
(74) *Attorney, Agent, or Firm*—Jenkins, Wilson, Taylor & Hunt, P.A.

(57) ABSTRACT

The invention relates to a power-saving multibit delta-sigma converter (1) comprising: an input (2) for an analog input signal (ZA) and an output (3) for a digital output signal (ZD); a digital-to-analog converter (4) having a bit width N and serving to convert the digital output signal (ZD) to an analog feedback signal (Z3); a summing device (5) for solving the difference between the input signal (ZA) and the feedback signal (Z3); a filter (6) for filtering the difference signal (Z1); and a clocked quantizing device (7) for quantizing the filtered difference signal (Z2) into a digital output signal (ZD) with the bit width N. Said quantizing device (7) comprises a number of comparators (21, 22, 23) that compare the filtered signal (Z2) with a respective reference potential (U0, U6) associated with each comparator (21, 22, 23) and they each output a comparison result (V1, V2, V3) to a decoder (33), which generates the digital output signal (ZD) from the comparison results (V1, V2, V3), and the reference potentials (U0, ... U6) are updated according to a previous comparison result.

20 Claims, 11 Drawing Sheets

U.S. PATENT DOCUMENTS

| | | |
|---|---|---|
| 6,473,019 B1 | 10/2002 | Ruha et al. |
| 6,642,873 B1 | 11/2003 | Kuang |
| 6,803,870 B2 * | 10/2004 | Kuttner ...................... 341/155 |
| 7,113,119 B2 * | 9/2006 | Van Veldhoven et al. .... 341/143 |
| 7,268,715 B2 * | 9/2007 | Guimaraes .................. 341/143 |

FOREIGN PATENT DOCUMENTS

| | | |
|---|---|---|
| DE | 43 11 259 | 4/1992 |
| DE | 43 11 966 | 4/1992 |
| DE | 696 20 285 | 2/1995 |
| EP | 0 686 323 | 2/1994 |

OTHER PUBLICATIONS

International Search Report with Written Opinion dated Feb. 2, 2005.
International Preliminary Examination Report dated Apr. 2, 2005.

* cited by examiner

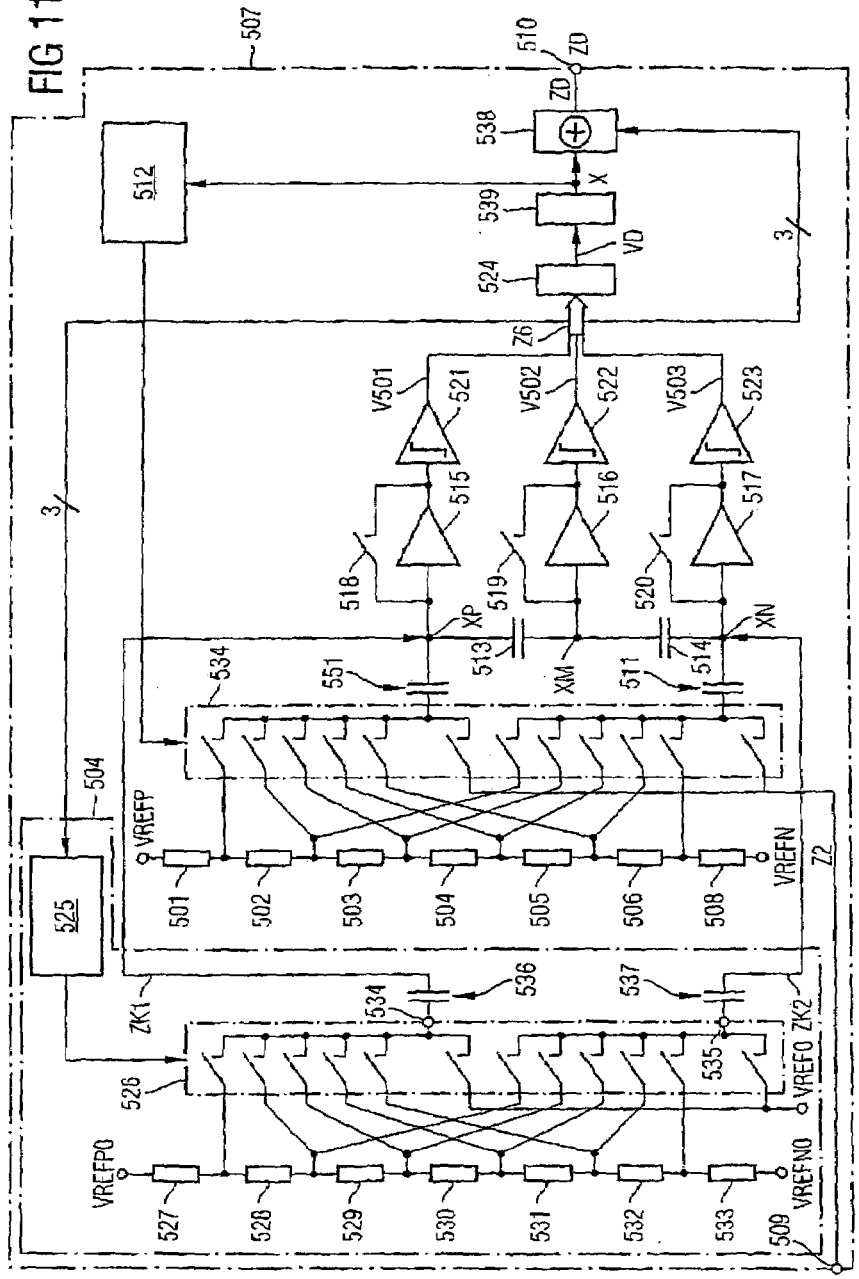

POWER-SAVING MULTIBIT DELTA-SIGMA CONVERTER

The present invention relates to a power-saving multibit delta-sigma converter in which, in particular, the number of comparators in its quantizer has been reduced.

So-called delta-sigma converters are often used as analog-to-digital converters because they offer high quantizations and a large signal-to-noise ratio.

A simple generally known one-bit delta-sigma converter supplies a one-bit data stream from an analog input signal. If the amplitude of the analog input signal rises, a logic H level is predominant at the output of the delta-sigma converter, and if said amplitude falls, a logic L level is predominant. With a constant input signal, the digital output signal fluctuates between the H and L levels. The analog signal can then be obtained from the bit stream again in principle by integration.

Such a one-bit delta-sigma converter essentially consists of two blocks: an analog modulator and a digital filter. In this case, the modulator is in principle only a comparator with an integrator connected upstream thereof. An output signal converted back by a one-bit digital-to-analog converter is subtracted from the analog input signal by a differential amplifier. This signal from the differential amplifier is fed to a comparator with an integrator connected upstream thereof. Thus, the comparator is continually reset and the one-bit data stream arises.

Since, at small input levels, the quantization noise is relatively large in the case of this one-bit conversion because the digital output signal only fluctuates completely between H level and L level, a multibit delta-sigma modulation is often used.

Figure 1:
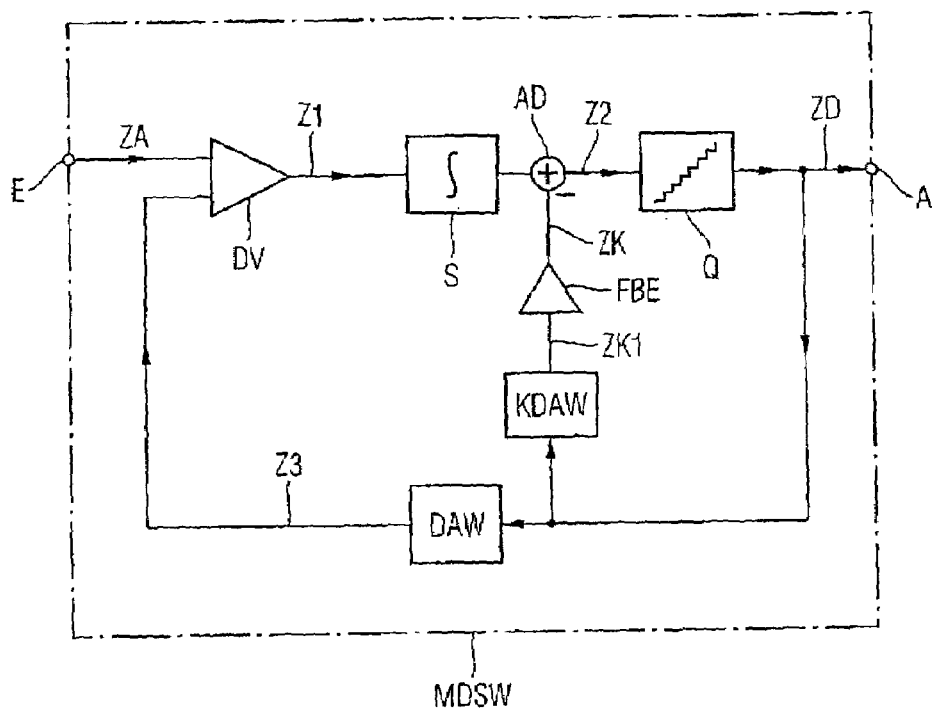

A multibit delta-sigma converter that is generally known according to the prior art is illustrated in FIG. 1.

The multibit delta-sigma converter MDSW has an input E for coupling in an analog input signal ZA and an output A for outputting an N-bit-wide digital output signal ZD. A digital-to-analog converter DAW having a bit width of N is provided, which converts a feedback signal Z3 from the digital output signal ZD. The feedback signal Z3 is subtracted from the analog input signal ZA by a differential amplifier DV. The difference signal Z1 thus obtained is integrated by an integrator S and fed as integrated signal Z2 to an N-bit quantizer, which forms the digital output signal from it.

A compensation digital-to-analog converter KDAW is often provided as well, which converts the digital output signal ZD back into an analog compensation signal ZK1, which is subsequently amplified by a compensation factor in an amplifier FBE and, as compensation signal ZK, is subtracted from the filtered signal Z2 by means of an adding device AD. The stability and the signal-to-noise ratio can be improved by means of said compensation signal ZK if a significant time offset prevails between the sampling instants of the quantizer Q and the sampling instant of the feedback digital-to-analog converter DAW. Said time offset, which is also known as excess loop delay, leads to instabilities and a poor signal-to-noise ratio particularly at high clock frequencies. An improvement in the output signal quality can then be achieved by means of such a compensation path having a likewise N-bit-wide compensation digital-to-analog converter KDAW. The circuitry outlay is considerable since the compensation digital-to-analog converter KDAW must have the same bit width N as the quantizer.

Figure 2:
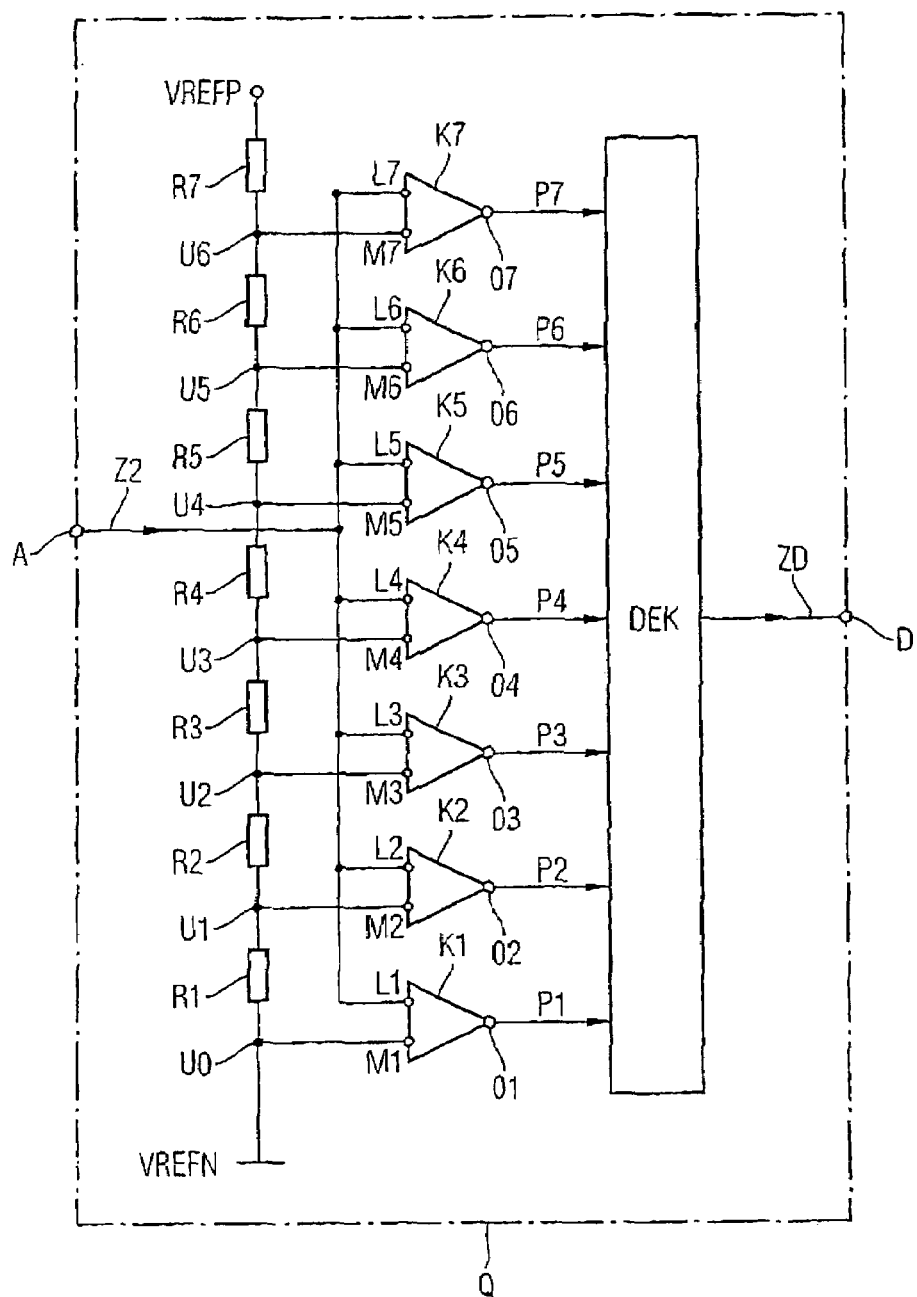

The quantizer Q is generally embodied as a flash analog-to-digital converter. A corresponding circuit arrangement of an appropriate quantizer Q is illustrated in FIG. 2.

The illustration shows by way of example a three-bit quantizer Q having an input A for receiving the integrated signal Z2 and an output D for outputting the digital output signal D. Seven comparators K1, . . . K7 are provided, having in each case a first input L1, . . . L7 for receiving the integrated signal Z2, in each case a second input M1, . . . M7 for the connection of a respective reference potential U1, . . . U7, and in each case an output U1, . . . U7 for outputting a comparison result P1, . . . P7. The comparison results P1, . . . P7 are passed to a decoder DEK which forms the digital output signal ZE.

The reference potentials U0, . . . U6 are tapped off between resistors R1, . . . R7 of a resistor chain connected between an upper reference potential VREFP and a lower reference potential VREFN. Thus, the comparison results are present in each case either as an H level or an L level. Depending on the level of the integrated analog input signal Z2, the respective comparators switch an H level or an L level as comparison result to the decoder.

The comparison results are thus present in a thermometer code, and the decoder forms therefrom a suitable, e.g. binary coded digital output signal ZD.

A particularly great disadvantage of this quantizer arrangement Q according to the prior art resides in its high current consumption. Quantizers are particularly great power consumers. Since the number of required comparators rises exponentially with the bit width N of a quantizer Q, multibit delta-sigma converters according to the prior art with a high bit width also have a high power consumption.

By way of example, fifteen comparators are required in the case of a quantizer for a four-bit delta-sigma converter. Furthermore, a likewise 4-bit-wide compensation digital-to-analog converter has to be available. Therefore, multibit delta-sigma converters with a high bit width are generally great power consumers.

The present invention is based on the object, then, of providing a power-saving multibit delta-sigma converter which, in particular, has a small number of comparators and a small area requirement as an integrated circuit.

According to the invention, this object is achieved by a power-saving multibit delta-sigma converter having the features of patent claim 1. Furthermore, the object is achieved by a multibit delta-sigma converter having the features of coordinate patent claim 10.

Accordingly, provision is made of a power-saving multibit delta-sigma converter comprising an input for an analog input signal and an output for a digital output signal, a digital-to-analog converter having a bit width N and serving to convert the digital output signal to an analog feedback signal, a summing device for forming the difference between the input signal and the feedback signal, a filter for filtering the difference signal and a clocked quantizing device for quantizing the filtered difference signal to form the digital output signal with the bit width N. In this case, the quantizing device has a number Y of comparators which compare the filtered signal with a respective reference potential associated with the respective comparator and which each output a comparison result to a decoder, which generates the digital output signal from the comparison results. In this case, the reference potentials are tracked in a manner dependent on a previous comparison result.

Furthermore, provision is made of a power-saving multibit delta-sigma converter comprising an input for an analog input signal and an output for a digital output signal, a digital-to-analog converter having a bit width N and serving to convert the digital output signal to an analog feedback signal, a summing device for forming the difference between the input signal and the feedback signal, a filter for filtering the difference signal, and a clocked quantizing device for quantizing the filtered difference signal to form the digital output signal with the bit width N. In this case, the quantizing device applies a potential offset to the filtered signal and has a number Y of comparators which compare the filtered signal to which said potential offset has been applied with a respective reference potential associated with the respective comparator and which each output a comparison result to a decoder, which generates the digital output signal from the comparison results. Furthermore the potential offset is tracked in a manner dependent on a previous comparison result.

The idea on which the present invention is based consists in reducing the number of comparators through knowledge of the comparison results—or knowledge of the converter results and thus of the digital output signal—at a previous instant. Since the analog filtered input signal of the quantizing device changes only slowly with regard to the clock frequency, a change in the thermometer code which is output by the comparators takes place at only one of the comparators. It therefore suffices according to the invention to localize the comparator which changes relative to its output comparison result with respect to a preceding clock cycle. Thus, the corresponding digit in the thermometer code and only a few further comparators are kept. From clock cycle to clock cycle only the changing comparison results are relevant which are characterized in that the switching threshold of the corresponding comparator is close to the level of the analog filtered signal. According to the invention, a potential offset can also be applied to the filtered signal, whereby a signal to which said potential offset has been applied is passed to the comparators of the quantizing device, the potential level of which signal is always tracked in proximity to the threshold voltages of the—according to the invention reduced number of—comparators. By virtue of the fact that the quantizing device in the power-saving multibit delta-sigma converter according to the invention has fewer comparators than a corresponding N-bit-wide quantizer according to the prior art, the multibit delta-sigma converter according to the invention is extremely power-saving. Moreover, the area requirement on a semiconductor chip is much smaller than in the case of otherwise customary converters.

In one preferred embodiment, the summing device has a differential amplifier for amplifying the difference between the input signal and the feedback signal, and/or the filter has an integrator for integrating the amplified difference signal.

The quantizing device of the multibit delta-sigma converter according to the invention preferably has fewer than $2^N-1$ comparators.

In one preferred development of the multibit delta-sigma converter, the quantizing device has a switching controller, which switches reference potentials to the comparators in a manner dependent on the previous comparison result, so that at least one of the comparators changes its comparison result in the event of a change in the input signal (ZA). Provision is preferably made of a memory for buffer-storing the digital output signal. That comparator which corresponds to a digit of the thermometer code and which has a switching threshold that is closest to the level of the filtered signal can be localized from the stored digital output signal.

The switching controller is preferably coupled to the memory and switches the reference potentials to the comparators in a manner dependent on the buffer-stored output signal.

In one preferred embodiment of the multibit delta-sigma converter according to the invention, the quantizing device has at least one first, second and third comparator each having a first input, a second input and an output. In this case, the filtered signal is applied to the first inputs and a first, second and third reference potential are respectively applied to the second inputs. The outputs of the comparators each supply a comparison result and the reference potentials are chosen such that the second reference potential lies between the first and third reference potentials and that the second reference potential is closest to the potential of the filtered signal.

In one embodiment of the quantizing device having only three comparators, it is possible in each case to coordinate or track the reference potentials in such a way that the second or middle comparator changes its comparison result from clock cycle to clock cycle. In the three-bit thermometer code, the totality of the comparison results of the three comparators then corresponds respectively to the analog filtered input signal exhibiting a rise, remaining constant or exhibiting a fall. The decoder can construct the corresponding digital output signal or the complete thermometer code from this on the basis of the known previous converter result. A major advantage of this preferred embodiment is that only three comparators are actually sufficient even at high bit widths.

Furthermore, it is advantageous that the reference potentials are chosen to be equidistant, and that $2^N-1$ different reference potentials can be switched.

In another preferred development of the invention, the digital-to-analog converter and the quantizing device can be operated with the bit width N and with the bit width M=In(Y+1)/In(2), where the bit width M corresponds to the number Y of comparators.

It is thereby possible to operate the multibit delta-sigma converter according to the invention in a first operating mode with a bit width M, the quantizing device functioning as a simple flash analog-to-digital converter, that is to say with a reduced resolution. This is advantageous in particular if, in a switch-on phase, the reference potentials to the comparators are initially unknown because a reliable conversion result of the preceding clock or converter cycle is not ready. It is not until in a second operating mode that the multibit delta-sigma converter is then operated with the full bit width N and with tracked reference potentials. This serves for the stability of the entire multibit delta-sigma converter according to the invention.

The digital-to-analog converter and the quantizing device can preferably be changed over between the two bit widths N and M. In the advantageous development, the switching controller preferably has a counting device for generating a digital mean value signal in $2^N-Y$-digit thermometer code in a manner dependent on the comparison results. The counting device particularly preferably has an up/down counter.

The up/down counter represents, in a simple manner, that part of the output signal present in thermometer code which is constant from conversion to conversion, to which is added a difference signal essentially corresponding to the Y-digit thermometer code from the comparison results. This is preferably done in the decoder, which has an adding device for forming the N-bit-wide output signal from the comparison results and the mean value signal.

In one preferred embodiment, the switching controller furthermore has a control logic which, in a manner dependent on the comparison results, either switches the comparison results in Y-digit, M-bit-wide thermometer code as digital output signal or switches the comparison results combined with the mean value signal as digital output signal in $2^N$-digit, N-bit-wide thermometer code. Thermometer code with $2^N$ digits can be transmitted on $2^N-1$ data lines.

The control logic operating as a capture circuit controls the quantizing device either as an M-bit flash analog-to-digital converter or as an N-bit analog-to-digital converter in which the reference potentials for the comparators used are tracked according to a converter result or a potential offset is applied to the input signal. This has the advantage that the tracking of the reference potentials takes place only when a stable operating point of the control loop of the quantizing device has been found.

In a further preferred embodiment, the switching controller has a reference digital-to-analog converter for generating the offset potential from the digital mean value signal. Since the mean value signal is present as a $2^N$-Y-digit thermometer code signal on $2^N$-Y-1 data lines, a reference digital-to-analog converter is a particularly simple device for generating the potential offset.

In a further preferred development of the multibit delta-sigma converter according to the invention, the quantizing device has a compensation analog-to-digital converter for converting the comparison results into at least one analog compensation signal and has an adding device for subtracting the analog compensation signal from the filtered difference signal.

The compensation analog-to-digital converter advantageously serves to compensate for an excess loop delay between the sampling instants of the clocked quantizing device and the digital-to-analog converter for the analog feedback signal.

The bit width of the compensation analog-to-digital converter advantageously corresponds to the number of comparators in the quantizing device. In the development according to the invention, by comparison with the prior art, it is accordingly possible to use a feedback digital-to-analog converter that is considerably reduced in terms of bits, whereby firstly the signal quality of the output signal is considerably improved and secondly the multi delta-sigma converter becomes power-saving. This is because in the feedback digital-to-analog converter only as few converter cells are required as in the follow-up quantizer or analog-to-digital converter used according to the invention.

In one preferred embodiment of this development, provision is furthermore made of an amplifier for amplifying the analog compensation signal with a compensation factor. Such an amplifier permits the compensation factor to be set optimally, so that a particularly good signal quality or a particularly high signal-to-noise ratio occurs even in the case of excess loop delays. The multibit delta-sigma converter according to the invention is thus also particularly suitable for use in systems which require a high bandwidth and extremely high clock frequencies, as is the case, for example in xDSL or UMTS applications.

Further advantageous refinements and developments of the invention are the subject matter of the subclaims and of the description with reference to the drawings.

Figure 3:
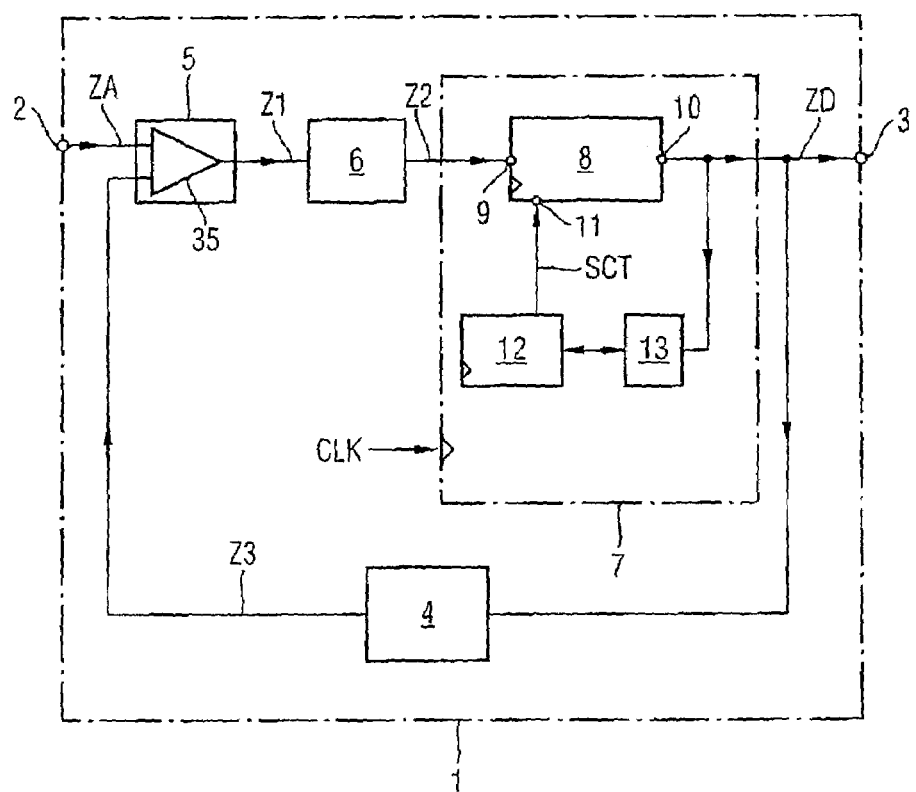
Figure 4:
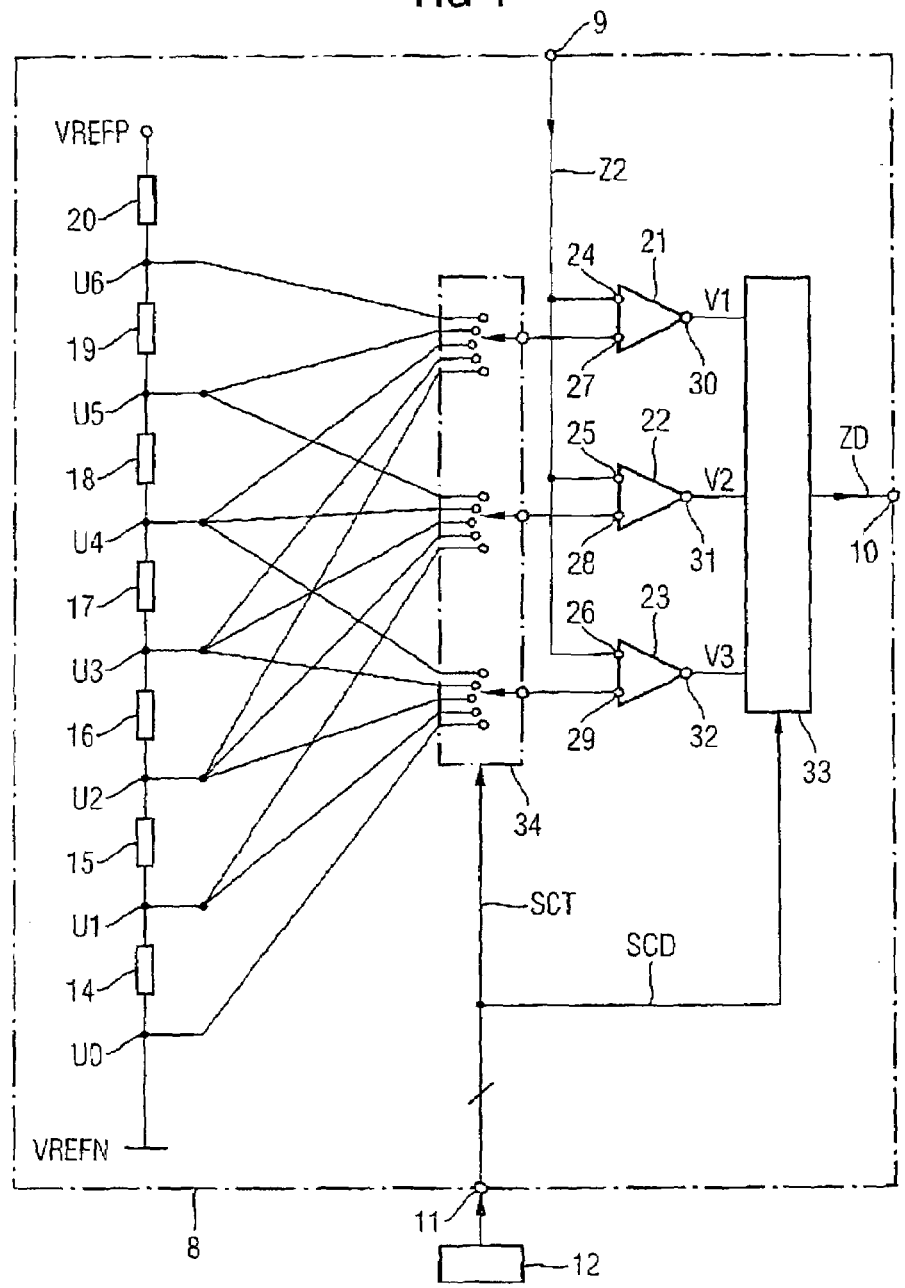
Figure 5:
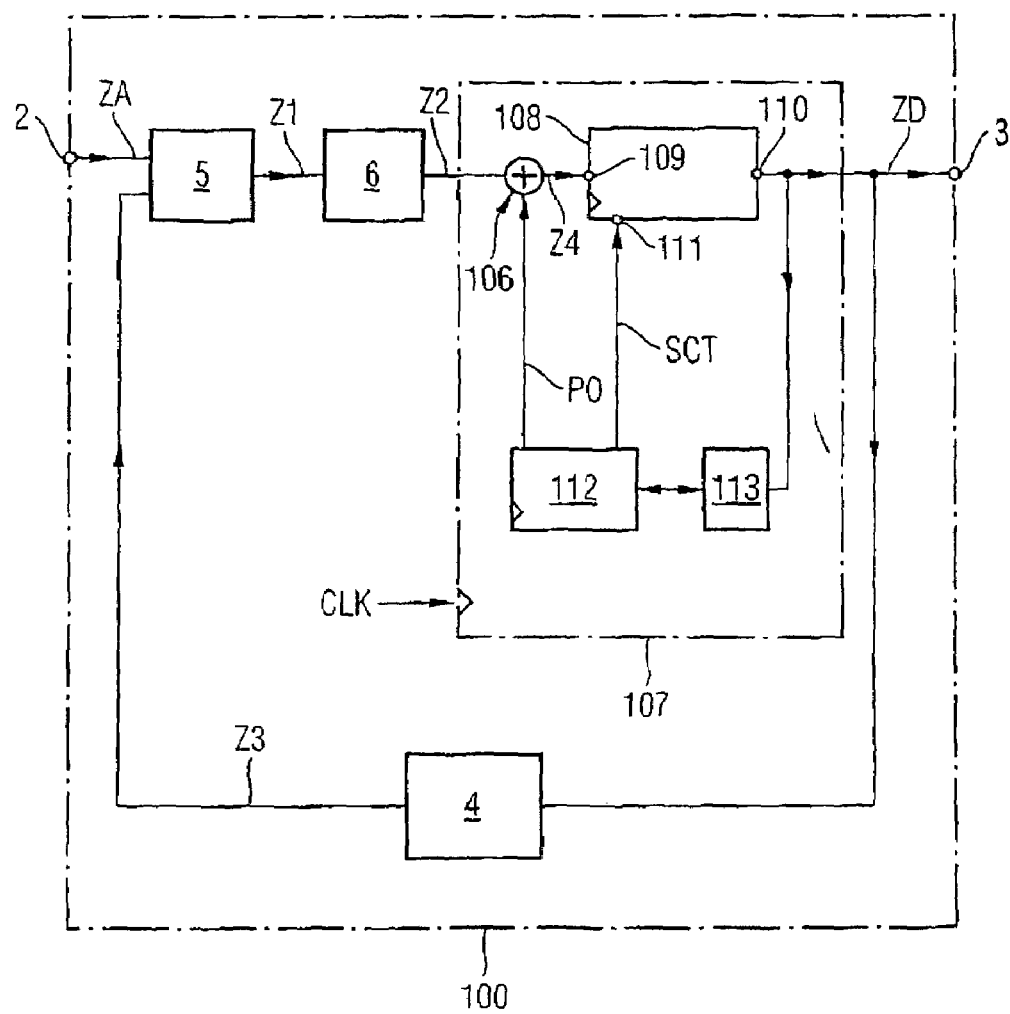
Figure 6:
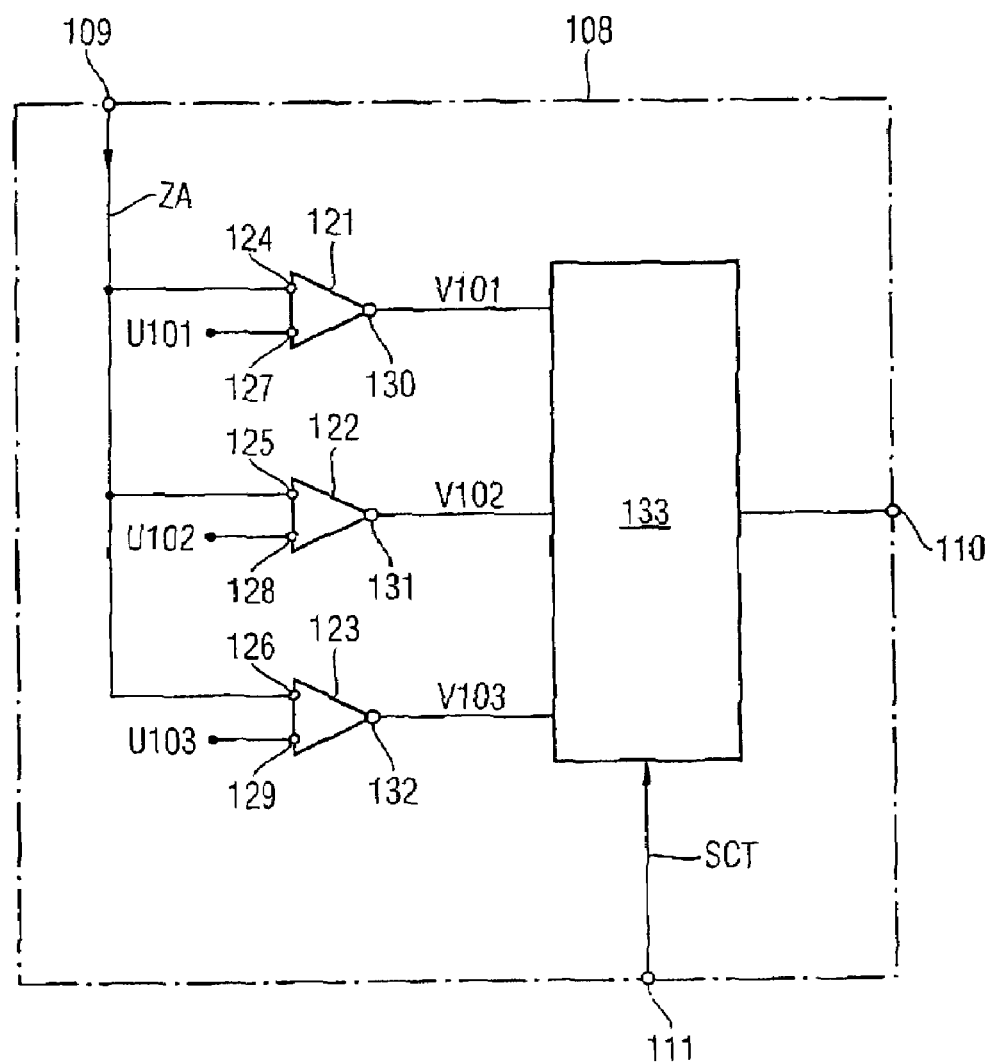
Figure 7:
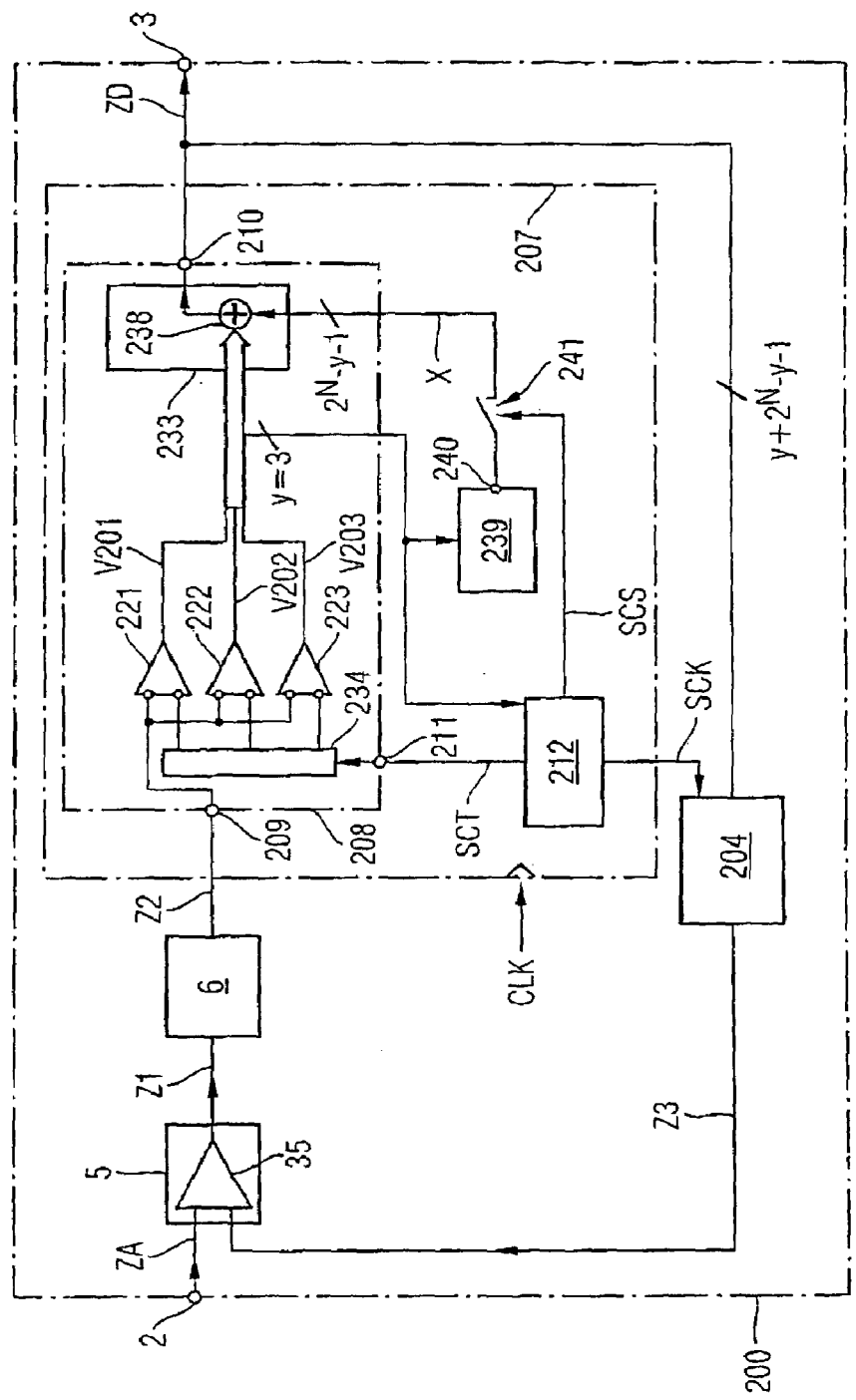
Figure 8:
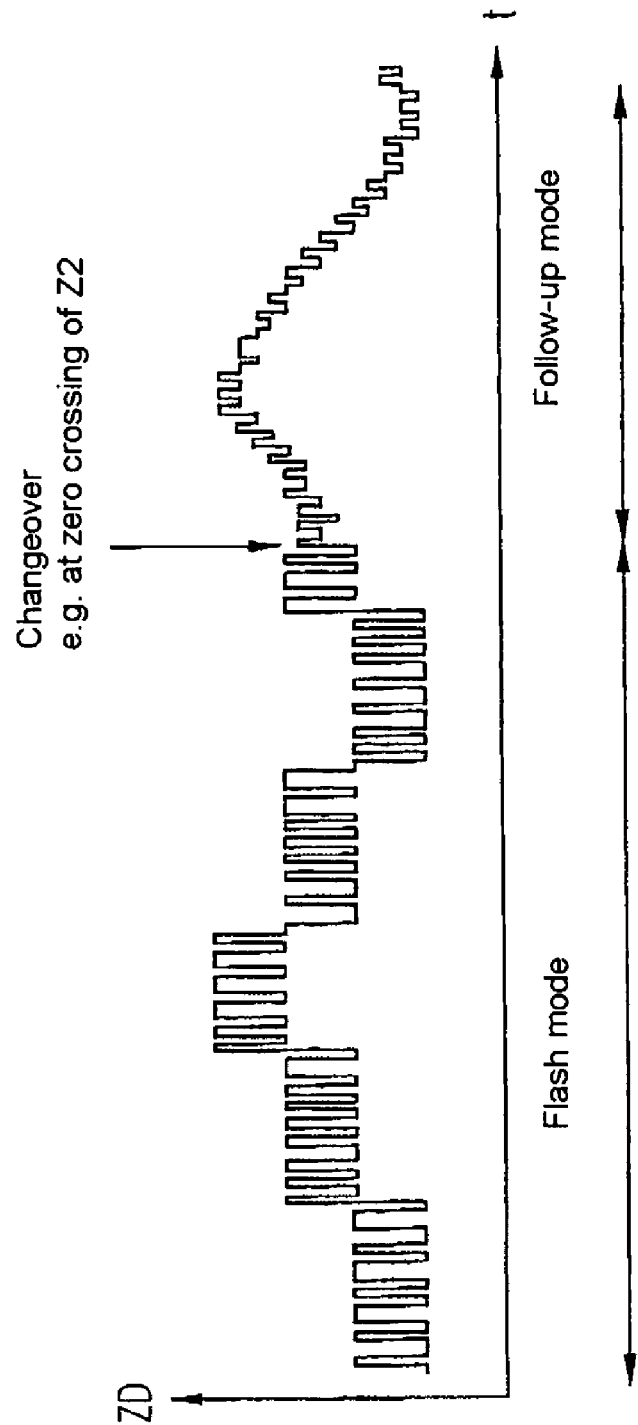
Figure 9:
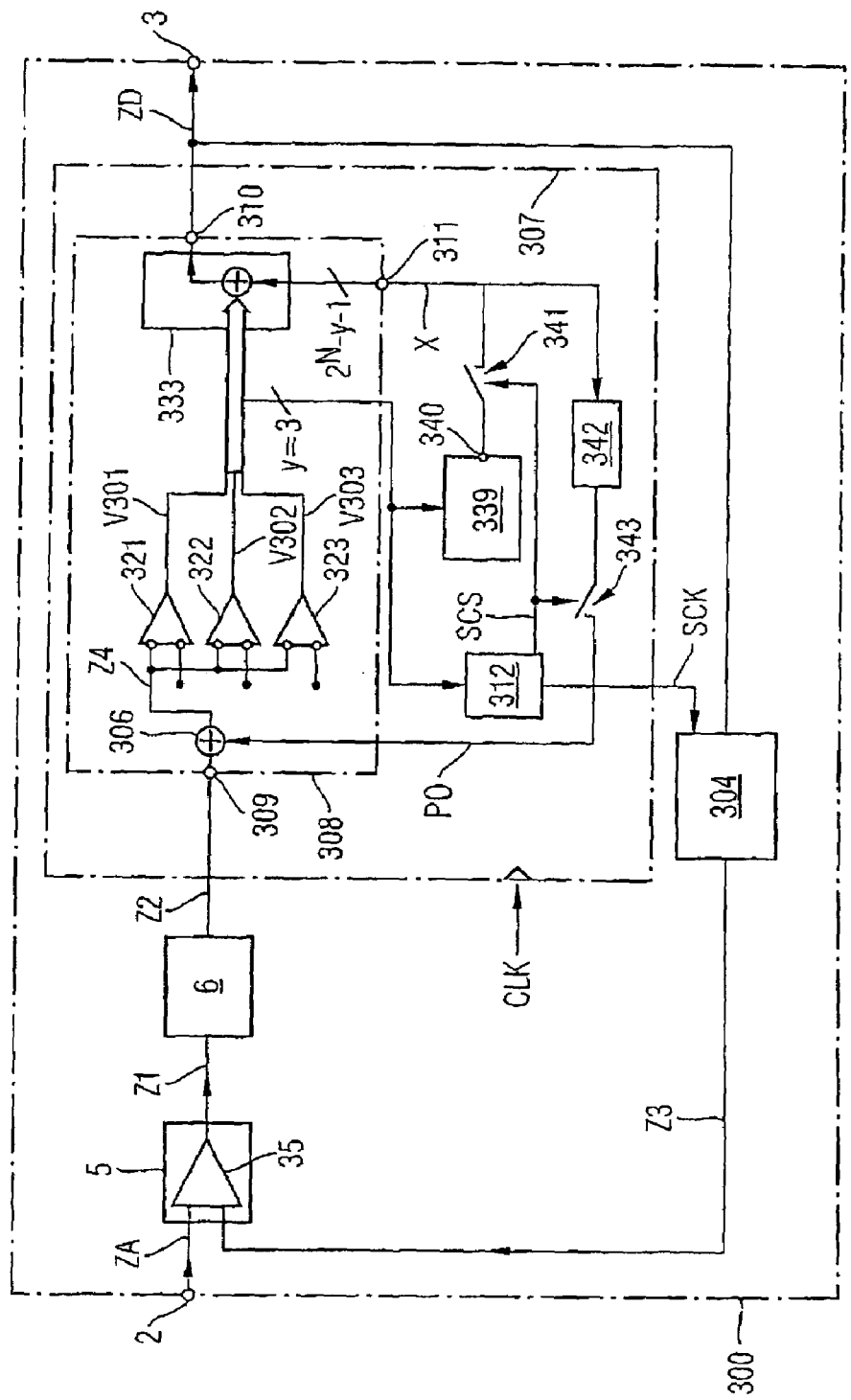
Figure 10:
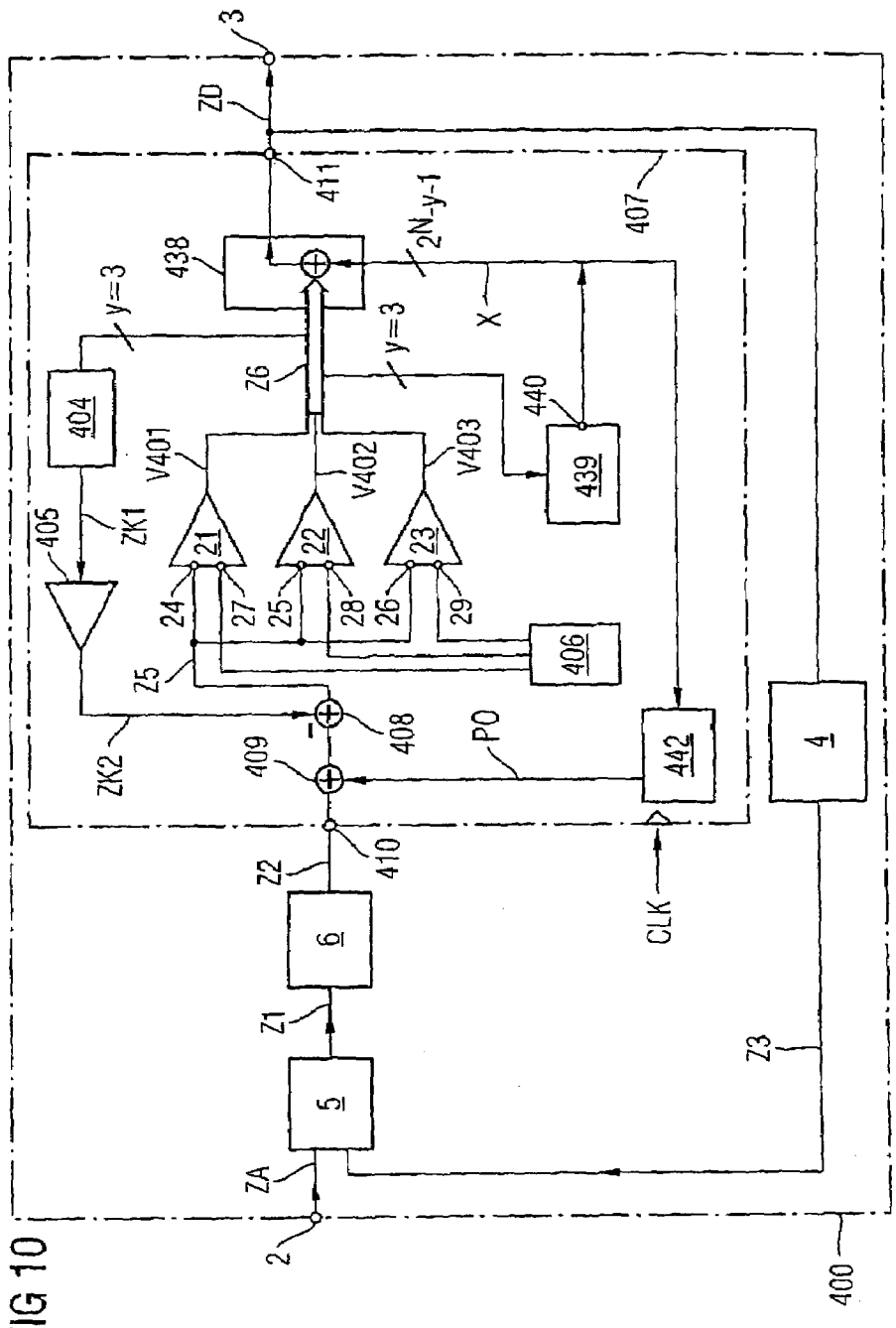

The invention is explained in more detail below on the basis of the schematic figures and the exemplary embodiments. In the figures:

FIG. 1: shows a multibit delta-sigma converter according to the prior art;

FIG. 2: shows a 3-bit quantizer according to the prior art;

FIG. 3: shows an embodiment of a power-saving multibit delta-sigma converter according to the invention;

FIG. 4: shows an embodiment of a quantizing device according to the invention;

FIG. 5: shows a second embodiment of a power-saving multibit delta-sigma converter according to the invention;

FIG. 6: shows an exemplary embodiment of a comparison device according to the invention;

FIG. 7: shows a first development of the power-saving multibit delta-sigma converter according to the invention;

FIG. 8: shows characteristic output signals of the power-saving multibit delta-sigma converter according to the invention in two operating modes;

FIG. 9: shows a second development of the power-saving multibit sigma-delta converter according to the invention; and FIG. 10: shows a third development of the power-saving multibit delta-sigma converter according to the invention;

FIG. 11: shows a development of a quantizing device according to the invention.

Identical or functionally identical elements are provided with identical reference symbols in the figures.

FIG. 3 shows a power-saving multibit delta-sigma converter according to the invention.

The multibit delta-sigma converter 1 has an input 2 for coupling in an analog input signal ZA and an output 3 for coupling out a digital output signal ZD. A digital-to-analog converter 4 is furthermore provided which converts the digital output signal ZD to an analog feedback signal Z3. The digital-to-analog converter 4 has a bit width N. A differential amplifier 5 is provided as a summing device and subtracts the feedback signal Z3 from the analog input signal ZA and amplifies the difference between the analog input signal ZA and the feedback signal Z3. This amplifying difference signal Z1 is integrated by a filter, which is embodied as an integrator 6 here. A clocked quantizing device 7 forms the digital output signal ZD from the filtered or integrated difference signal Z2.

The quantizing device supplies the digital output signal in the same bit width N which the digital-to-analog converter 4 has.

The thermometer code constitutes a conventional digital format. In this case, $2^N$ states correspond to $2^N$ ordered digits which each indicate logic states zero or one. The number of set digits corresponds to the decimal value of the corresponding digital signal. A decimal 4 in N=3-bit-wide binary code, that is to say 011, is mapped onto 00001111 in $2^N$=8-digit thermometer code. Since zero in this case is represented as 00000000 thermometer code symbol, in each case one data line fewer than digits is required for transmission, that is to say $2^N-1$ data lines.

The quantizing device 7 has a switching and comparison device 8 having an input 9 for coupling in the integrated signal Z2, an output 10 for coupling out the digital output signal ZD and a control input 11 for one or more control signals SCT. The switching and control signals SCT are generated by a control logic 12 coupled to a buffer memory 13. The buffer memory 13 stores the digital output signal ZD from a previous clock cycle. The quantizing device 7 therefore quantizes the integrated signal Z2 in a manner dependent on a quantization result of a previous clock cycle. The mode of operation of a preferred embodiment of the switching and comparison device is elucidated in FIG. 4.

FIG. 4 shows a preferred embodiment of a switching and comparison device 8 according to the invention. The switching and comparison device 8 illustrated is designed by way of example for a quantizing device which supplies an N=3-bit-wide digital output signal ZD. In a three-bit quantizer $2^N-1$, that is to say seven comparators usually have to be kept available.

The switching and comparison device 8 has an input 9 for coupling in the integrated signal Z2, an output 10 for coupling out the digital output signal ZD, and a control input 11 for receiving one or more control signals SCT.

Provision is further made of seven resistors 14-20, which are connected in series between an upper reference potential VREFP and a lower reference potential VREFN. Six reference potentials U1, U2, U3, U4, U5, U6 can be tapped off between the resistors 14-20. The lower reference potential VREFN furthermore serves as zeroth reference potential U0.

Provision is made of y=3 comparators 21, 22, 23 having in each case a first input 24, 25, 26, to which the integrated signal Z2 is applied, in each case a second input 27, 28, 29 and in each case an output 30, 31, 32 for outputting a respective comparison result V1, V2, V3.

The comparison results are fed to a decoder, which generates the digital output signal ZD therefrom in a manner dependent on a coding control signal SCD. Like the control signals SCT, the decoding control signal SCD can be supplied by a control logic 12. A switching device 34 controlled by the switching signal SCT switches through in each case one of the reference potentials U0, U1, U2, U3, U4, U5, U6 to the second inputs 27, 28, 29 of the comparators 21, 22, 23.

The control signals SCT or a corresponding control logic 12 controls the switching device 34 in such a way that in the event of a change in the integrated signal Z2 from one clock cycle to the next, the switching point of the middle or second comparator 22 is always closest to the level of the integrated signal Z2. If, by way of example, the level of the integrated signal Z2 lies between the reference potential U1 and U2 during a first converter cycle or clock cycle, and the switching threshold of the first comparator 21 is at U3, that of the second comparator 22 is at U2 and that of the third comparator is at U1, the comparison results read V1=L, V2=L and V3=H. If, with respect to a second, subsequent clock cycle, the level of the integrated signal Z2 then rises between U2 and U3, the comparators, given unchanged threshold voltages, supply a comparison result V1=L, V2=H and V3=H.

The threshold voltages of the three comparators 21, 22 and 23 are set such that they cover the segment in a complete three-bit-wide thermometer code (eight digits each having H or L) in which a change occurs from H to L from a less-significant to a more-significant bit. However, since the previous comparison results are known as a result of buffer-storage for example in a buffer memory as described in FIG. 3, a complete thermometer code 3 bits wide, that is to say having eight digits, can be reconstructed by a coder 33, which then also generates a corresponding digital output signal ZD for example also in a binary code.

The reference potentials U0-U6 are always switched to the second inputs 27, 28, 29 of the comparators 21, 22, 23 such that the first comparator 21 has a higher switching threshold than the second comparator 22 and the second comparator 22 has a higher switching threshold than the third comparator 23.

The switching thresholds between the first and second comparators 21, 22 and the difference in the switching thresholds between the second and third comparators 22, 23 correspond in each case to precisely one digit in a thermometer code that is predetermined by the equidistant reference potentials U0-U6.

From clock cycle to clock cycle, the reference potentials or switching thresholds of the comparators 21, 22, 23 are either offset upward or downward by one digit in the thermometer code or—if a transition from H to L level is already present between the comparison result V1 and U2 or V2 and U3—are maintained.

As a result of the tracking of the reference potentials by the switching device 34 controlled by the control logic 12, which tracks the respective reference potentials in a manner dependent on a previous comparison result or converter result, the switching thresholds of y=3 comparators 21, 22, 23 are controlled in such a way that they are in proximity to the level of the integrated signal Z2, whereby a considerable saving of comparators is possible according to the invention.

A conventional three-bit quantizer, as is illustrated in FIG. 2, would have to have seven comparators each having a high area requirement and a high power consumption.

In this case, "in proximity to the level" is understood to mean that the level of the integrated signal Z2 lies at least between the next higher reference potential with respect to the switching threshold of the first comparator and the next lower reference potential with respect to the switching threshold of the third comparator.

Moreover, a quantizing device according to the invention for use in a multibit delta-sigma converter has an outstanding linearity because the quantization result depends only on three or fewer comparators. That is to say a quantization characteristic curve always has quantization levels that are identical in magnitude. Since the prior art involves the use of many comparators, this is not usually ensured since the comparators may have fluctuations among one another. Consequently, reducing the number of comparators also yields an improvement in the signal quality of the multibit delta-sigma converter.

FIG. 5 shows a second embodiment of a multibit delta-sigma converter according to the invention.

The multibit delta-sigma converter 107 according to the invention has essentially the same elements as in FIG. 3, but the quantizing device 107 applies a potential offset PO to the filtered or amplified and integrated signal Z2 on the input side.

The quantizing device 107 has a comparison device 108 having an input 109 for coupling in the filtered signal Z4 to which a potential offset PO has been applied, an output 110 for coupling out the digital output signal ZD and a control input 111 for one or more control signals SCT.

The switching and control signals SCT are generated by a control logic 112 coupled to a buffer memory 113. The potential offset PO is supplied by the control logic 112 and added to the filtered signal Z2 by means of an adder 106.

The buffer memory 13 stores the digital output signal ZD from a previous clock cycle. The quantizing device 107 firstly brings about said application to the filtered signal Z2 and therefore quantizes the signal Z4 subjected to said application in a manner dependent on a quantization result of a previous clock cycle. The filtered signal Z2 is subjected to said application in such a way that the resulting signal level of the signal Z4 subjected to said application is always between the threshold voltages or reference potentials of, for example, three comparators which are arranged in the comparison device 108.

FIG. 6 shows an exemplary embodiment of a comparison device 108 according to the invention.

The switching and comparison device 108 has an input 109 for coupling in the signal Z4 subjected to said application, an output 110 for coupling out the digital output signal ZD, and a control input 111 for receiving one or more control signals SCT.

Provision is made for three comparators 121, 122, 123 having in each case a first input 124, 125, 126, to which is applied the signal Z4 subjected to said application, in each case a second input 127, 128, 129 and in each case an output 130, 131, 132 for outputting a respective comparison result V101, V102, V103.

The comparison results are fed to a decoder 133, which generates the digital output signal ZD therefrom in a manner dependent on a coding control signal SCD. Like the control signals SCT, the decoding control signal SCD may be supplied by a control logic 112. In each case one of reference potentials U101, U102, U103 is switched to the second inputs 127, 128, 129 of the comparators 121, 122, 123. Said reference potentials are found and provided in equidistant fashion here.

The corresponding control logic 112 controls the potential offset PO in such a way that in the event of a change in the filtered signal Z2 from one clock cycle to the next, the switching point of the middle or second comparator 122 is always closest to the level of the signal Z4 to which the potential offset PO has been applied. The corresponding comparison results V101, V102, V103 are processed by the decoding device 133 taking account of the potential offset PO, which may be positive or negative and the previous conversion result, which is buffer-stored in the buffer memory 113. This is controlled by means of the control signals SCT.

By virtue of the tracking of the potential offset in a manner dependent on the previous conversion result, it is again possible, according to the invention to reduce the number of comparators relative to the prior art.

FIG. 7 shows an advantageous development of the multibit delta-sigma converter according to the invention with a special quantizing device 207.

The basic structure of the multibit deltabit-sigma converter 200 essentially corresponds to the explanations concerning FIGS. 3 and 5. However, the quantizing device 207 and the digital-to-analog converter 204 can be operated with different bit widths.

The quantizing device 207 has a switching and comparison device 208 having an input 209 for the filtered signal Z2, an output 210 for the digital output signal ZD, a switching device 234, three comparators 221, 222, 223 and a decoder 233. The three comparators 221, 222, 223 are fed the filtered signal Z2 and suitable reference potentials from the switching device 234, as is also described in FIG. 4. The comparison results V201, V202, V203 are fed to the decoder 233.

The decoder 233 combines the Y=3-digit thermometer code or the comparison results V201, V202, V203 with a $2^N$–Y=5-digit thermometer code signal, the mean value signal X, to form the output signal ZD. This is done in an adding device 238.

The mean value signal X is provided by an up/down counter 239, which is coupled to the outputs of the comparators 221, 222, 223 via three data lines. At its output 240, the up/down counter 239 supplies a digital signal in $2^N$–Y-digit thermometer code on $2^N$–Y–1 data lines. If the comparison result V201, V202, V203 becomes larger from one clock cycle to the next, the up/down counter 239 counts up and if the comparison result becomes lower, the up/down counter 239 decrements the mean value signal X by one digit in the thermometer code. Given the number of y=3 comparators 221, 222, 223 chosen here, a mode of counting is appropriate in which the value at the output 240 of the up/down counter 239 remains unchanged if only the comparison result V202 of the middle comparator 222 changes from one clock cycle to another, but the value is incremented/decremented by one digit in the thermometer code if the comparison result V201, V203 of the upper/lower comparator 221, 223 or the comparator 221, 223 operated with the highest/lowest reference potential changes. The potential window covered by the three comparators then always lies around the potential of the input signal of the quantizing device 207 or of the filtered signal Z2.

Furthermore, a control logic 212 is provided, which likewise evaluates the comparison results V201, V202, V203 in the Y=3-digit thermometer code. The comparison results may also be understood as a difference signal.

The control logic 212 supplies control signals to the switching device 234 and determines the reference potentials assigned to the comparators 221, 222, 223. The control logic 212 controls a controllable switch 241 by means of a control signal SCS, the controllable switch 241 being connected downstream of the output 240 of the up/down counter 239, feeding the mean value signal X to the decoder 233 in a closed state and not allowing a mean value signal X to pass in an open state.

The control logic 212 also changes over the digital-to-analog converter 204 between different conversion bit widths by means of a control signal SCK.

Two operating modes are possible in the advantageous development of the multibit delta-sigma converter 200 according to the invention. In the tracking or follow-up mode, as has also been described above in the explanations concerning FIGS. 3 to 6, the quantizing device 207 supplies at its output 210 an N=3-bit-wide digital output signal in thermometer code having $2^N$=8 digits. The fed-back output signal ZD is thus generally passed to the digital-to-analog converter 204 on 7 data lines.

In the second operating mode, the flash mode, the quantizing device 207 operates like a 2-bit flash analog-to-digital converter. The bit width M=ln(Y+1)/ln(2) corresponds to the number Y=3 of comparators 221, 222, 223 used. This 2-bit-wide difference signal from the comparison results V201, V202, V203 requires Y=3 data lines if it is represented in thermometer code. In the flash mode, the control logic 212 opens the controllable switch 241, so that the adding device 238 of the decoder 233 only forwards the difference signal, that is to say the comparison results V201, V202, V203 of the comparators 221, 222, 223 operating as flash analog-to-digital converters. In the flash mode, the control logic 212 signals to the digital-to-analog converter 204, which can be operated in a manner embodied as a 2-bit converter, that only the thermometer code signals of the digital output signal ZD that are fed on the Y=3 corresponding data lines are intended to be converted into the analog feedback signal.

The flash mode of the multibit delta-sigma converter 200 is particularly advantageous in the run-up or switch-on phase of the multibit delta-sigma converter. During run-up in the follow-up mode, the comparators 221, 222, 223 would always form the difference with respect to the previous conversion value, which is not known in the case of switch-on. The counter is then incremented or decremented in the up/down counter 239 in order to follow the input signal Z2 of the quantizing device 207. The output signal which is then generated is transferred to the digital-to-analog converter 204 in the feedback. If the quantizer increments the output signal ZD in the tracking mode, the inverted and filtered signal Z2 is decremented whereby a stable operating point can never be found.

Therefore, the control logic 212 is embodied as a capture circuit such that the quantizing device 207 operates as a flash converter during the run-up phase. This is done in the exemplary embodiment chosen here as a 2-bit flash analog-to-digital converter that is realized by the three comparators 221, 222, 223.

The control logic preferably switches the switching controller 234 by means of control signals SCT in such a way that the entire modulation range given by the difference between the highest reference potential and the lowest reference potential is fully utilized. In the case of a reference potential arrangement chosen analogously to FIG. 4, in the flash mode the reference potentials U0, U3 and U6 are then switched to the comparators 223, 222, 221. The resolution becomes coarser in this flash phase or the flash mode. As soon as a stable operating point is found, the control logic 212 switches into the tracking mode described previously and passes the mean value signal X or the result of the up/down counter 239 to the decoder 233, which combines an N-bit-wide output signal ZD from the difference signal represented by the comparison results V201, V202, V203 of the tracked comparators and the mean value signal X.

An exemplary signal profile of the digital output signal is shown in FIG. 8.

The control logic 212 monitors the comparison results V201, V202, V203 of the comparators 221, 222, 223 and switches from the flash mode into follow-up mode at a predetermined value of said difference signal. During the flash mode, the output signal ZD is quantized in two bits. If the control logic 212 detects a zero crossing of the quantizer input signal or of the filtered signal Z2, the control logic 212 switches the quantizing device 207 into the follow-up mode. The quantization takes place with three bits starting from the changeover instant.

FIG. 9 illustrates an alternative embodiment of the advantageous development of the multibit delta-sigma converter 300.

The construction essentially corresponds to the embodiment described in FIG. 7. However, the quantizing device 307 is configured in such a way as to apply a potential offset PO to the filtered signal Z2. Provision is made of a comparison device 308 having three comparators 321, 322, 323, a decoder 333 and an adder 306. The comparison results V301, V302, V303 of the comparators 321, 322, 323 are fed to the decoder 333 and a control logic 312 and also an up/down counter 339.

At an output 340, the up/down counter 339 supplies a mean value signal X in thermometer code with $2^N$–Y digits on $2^N$–Y–1 lines. The latter is fed via a controllable switch 341 at a control input 311 to the comparison device 308 and from there to the decoder 333.

The mean value signal X is additionally passed to a reference digital-to-analog converter 342, which generates the analog potential offset PO therefrom. Said potential offset is added to the filtered signal Z2 by means of the adder 306.

The control logic 312 switches the first controllable switch 341 and a second controllable switch 243, which is connected downstream of the reference digital-to-analog converter 342, by means of the switching signals STS.

In the flash mode, the control logic 312 separates the potential offset PO from the adder 306 by means of the controllable switch 343, and the control logic 312 separates the mean value signal X from the decoder 333 by means of the controllable switch 341.

Consequently, the alternative embodiment of the advantageous development of the multibit delta-sigma converter 300, as explained above in the explanations concerning FIG. 7, operates as a 2-bit multibit delta-sigma converter in the flash mode and as a 3-bit delta-sigma converter in the follow-up mode, only three comparators 321, 322, 323 in each case having to be kept available in both modes. The digital-to-analog converter 304 can likewise be changed over between a 2-bit and 3-bit converter mode by the control logic 312 by means of the control signal SCK.

FIG. 10 shows another advantageous development of the multibit delta-sigma converter 400.

The construction essentially corresponds to the embodiment described in FIG. 5, a compensation analog-to-digital converter 404 being provided for the compensation of a time offset between the sampling instants of the quantizing device 407 and the feedback digital-to-analog converter 4, said compensation analog-to-digital converter converting the comparison results V401, V402, V403, which form a digital thermometer code signal Z6 into a compensation signal ZK1. The clocked quantizing device 407 has an input 410 for the filtered analog signal Z2 or the filtered difference signal Z2 and an output 411 for the digital output signal ZD.

In the embodiment described here, three comparators 21, 22, 23 are provided, the reference connections 27, 28, 29 of which are connected to a reference signal generating unit 406. The reference signal generating unit 406 supplies suitable constant reference potentials. The filtered analog signal Z5 to which a potential offset PO and the compensation signal ZK2 have been applied is fed to the second inputs 24, 25, 26 of the comparators 21, 22, 23.

The three respective comparison results V401, V402, V403 form a bit-reduced digital signal Z6, which is fed to a counting device 439 and is fed to the 3-bit-wide feedback digital-to-analog converter 404 and to the adding device 438.

At its output 440, the counter device 439 supplies a mean value signal X as is known from the previous exemplary embodiments, which is likewise fed to the adding device 438.

The adding device 438 adds the mean value signal X and the conversion result or the digital signal Z6 formed from the comparison results V401, V402, V403 to form the digital output signal ZD of the corresponding multibit delta-sigma converter 400 and supplies it to the output 411 of the quantizing device 407.

The mean value signal X is furthermore fed to a reference digital-to-analog converter 442, which forms the analog offset potential PO therefrom, said offset potential PO being applied to the filtered analog signal Z2 by means of an adder 409.

The bit-reduced digital signal Z6 is furthermore fed through the compensation digital-to-analog converter 404, which has a bit width corresponding to the number of comparators 21, 22, 23. The compensation digital-to-analog converter 404 supplies a first compensation signal ZK1 which is amplified by a compensation or gain factor by an amplifier 405. The amplified first compensation signal ZK1 is combined as compensation signal ZK2, by means of a second adder 408, with the filtered signal to which the potential offset PO has been applied. The second analog compensation signal ZK2 is essentially subtracted from the filtered signal to which said potential offset has been applied.

The path formed from the compensation digital-to-analog converter 404, amplifier 405 and second adder 408 compensates for a time offset between the sampling instant of the feedback digital-to-analog converter 4 and the comparators 21, 22, 23 of the quantizing device 407. A particularly high signal quality can be achieved thereby.

It is particularly advantageous in this case, according to the invention to provide a compensation path within the quantizing device 407 since this means that only three digital-to-analog converter cells have to be provided in the compensation digital-to-analog converter 404.

It goes without saying that the procedure according to the invention can likewise be combined with the exemplary embodiments in accordance with FIGS. 3, 5, 7 and 9. The application of the bit-reduced compensation digital-analog converter 404 is illustrated merely by way of example in FIG. 10, the tracking of the quantizer window being realized by a potential offset PO for the input signal Z2.

FIG. 11 illustrates a second advantageous development of the quantizing device 507.

The quantizing device 507 has an input 509 for the filtered analog signal Z2 and an output 510 for the digital output signal ZD. A circuit arrangement 504 for forming a follow-up or tracking analog-to-digital converter is illustrated schematically here.

A chain of seven reference resistors 501-506, 508 connected in series is connected between an upper reference potential VREFP and a lower reference potential VREFN. As shown for example analogously in FIG. 4, reference potentials can be tapped off between the resistors 501-506, 508 and are fed to a controlled switching device 534. The switching device 534 also receives the analog filtered signal Z2 as an input signal.

The switching device 534 is controlled by a control logic 512 and switches either the analog filtered signal Z2 or correspondingly tracked or selected reference potentials via a respective capacitor 510, 511 to an upper and a lower line node XP, XN. Two further capacitors 513, 514 are connected in series between the line nodes XP, XN. A third, middle line node XM is provided between the two further capacitors 513, 514.

A first (operational) amplifier 515 is connected to the upper line node XP, a second amplifier 516 is connected to the middle line node XM and a third amplifier 517 is connected to the lower line node XN. The amplifiers 515, 516, 517 can be feedback-connected respectively via controllable switches 518, 519, 520.

A first, second and third comparator 521, 522, 523 are connected in the further signal path of the respective amplifiers 515, 516, 517, said comparators each supplying comparison results V501, V502, V503. The three comparison results V501, V502, V503 form a digital signal Z6, here having a bit width of three, by way of example. The digital signal Z6 is fed to a coding logic 524, which generates from it a step-up or step-down signal UD, which is fed to a counting device 539. The coding logic 524 supplies a step-up signal if the digital signal Z6 present in thermometer code rises by one digit from one clock cycle to the next, or a step-down signal if the thermometer code indicates a value lower than the previous converter result. Consequently the counter device 539 supplies a mean value signal X.

Said mean value signal is also fed to the control logic 512, which thus finally completes the bit-reduced follow-up analog-to-digital converter by switching or tracking the reference potentials to the amplifier-comparator combination 515, 521, 516, 522, 517, 523 in the manner according to the invention. An adding device 538 connected downstream of the counter device 539 combines the mean value signal X with the digital signal Z6 of the comparators 521, 522, 523 additively to form the digital output signal ZD, which can be tapped off at the output 510.

For the conversion of the filtered analog signal Z2, for example, in a sample and hold phase, during a first half clock cycle, the analog filtered signal Z2 is switched to the upper and lower line nodes XP, XN, and the feedback switches 518, 519, 520 of the amplifiers 515, 516, 517 are closed. The signal Z2 to be converted or its potential is thus present at all the inputs of the amplifiers 515, 516, 517. As a result of the feedback, an equilibrium state is established in each of the signal paths comprising an amplifier and a comparator. This is also referred to as a virtual ground at the respective comparator input.

In the conversion phase, that is to say during the respective second half clock cycle, the analog filtered signal Z2 is decoupled from the line nodes XP, XN, and instead of said signal a respective reference potential which can be tapped off at the resistor chain formed from the seven resistors 501-508 is connected via the capacitors 510, 511. In this conversion phase, the feedback switches 518, 519, 520 are open and the amplifiers 515, 516, 517 amplify the potentials of the line nodes XP, XM and XN which are present at the respective input.

The comparators 521, 522, 523 connected downstream then detect whether the corresponding input signal at the line nodes XP, XM, XN is greater or less than the potential present previously, that is to say the potential of the analog filtered signal Z2. A corresponding comparison result can then be tapped off as comparison signal V501, V502, V503 at the outputs of the comparators 521, 522, 523. The three comparison signals 501, 502, 503 thus form a 3-bit thermometer code signal Z6.

In the exemplary embodiment of the quantizing device 507 as illustrated here, the middle comparator 522 and amplifier 516 are in each case fed a reference potential in the converter phase which lies between the reference potentials fed to the upper 515 and lower 517 amplifier. This is achieved here by means of a capacitive coupling 513, 514 or voltage divider.

The controllable feedback switches 518, 519, 520 can be switched by a clock signal, for example, the switches being closed in a first half clock cycle and opened in a second half clock cycle.

In the advantageous development of the quantizing device 507, a circuit arrangement 504 is furthermore provided, which provides for compensation of time offsets between the sampling instants of the quantizing device 507 and the sampling instants of the digital-to-analog converter 4 used in the associated circuit for the multibit delta-sigma converter.

The circuit arrangement 504 essentially corresponds to a 3-bit digital-to-analog converter. The digital thermometer code signal Z6 is fed to a switching controller 525, which controls a second switch arrangement 526.

The circuit arrangement for said compensation digital-to-analog converter 4 has a resistor chain comprising seven resistors 527-533, which are chosen to be identical here and are connected in series between an upper and a lower compensation reference potential VREFP0, VREFN0. Compensation reference potentials can in each case be tapped off between the resistors 527-533 and are fed to the switching device 526. A further compensation reference potential VREF0 is furthermore fed to the switching device 526.

The switching device 526 respectively supplies an upper and a lower compensation signal ZK1, ZK2 at two outputs 534, 535. The upper compensation signal ZK1 is coupled to the upper line node XP via an upper capacitor 536, and the lower compensation signal ZK2 is coupled to the lower line node XN via a lower capacitor 537.

The control logic 525 controls the switches in the switching device 526 in such a way that the respective upper or lower compensation signal ZK1, ZK2 corresponds to an analog value corresponding to the digital thermometer code signal Z6. Moreover, the switching controller 525 switches the switching device 526 in such a way that between the potentials of the upper and lower compensation signals ZK1, ZK2 a voltage swing prevails which is proportional to the voltage swing between the respective reference potentials in the converter phase of the quantizing device with the amplifiers and comparators 515, 516, 517, 521, 522, 523. The respective proportionality factor or compensation factor can be achieved by changing the compensation reference potentials VREFP0, VREFN0.

Consequently, according to the invention, a digital-to-analog converted back comparison result or digital signal Z6 of the quantizing device, as compensation signal ZK1, ZK2 provided with a compensation factor, is impressed on or subtracted from the filtered analog signal Z2 to be converted.

The circuit arrangement 504 accordingly corresponds to a feedback digital-to-analog converter having a bit width of three, which, by means of the adjustable compensation reference potentials VREFP0 and VREFN0, simultaneously scales the compensation signal ZK1, ZK2 or provides it with a compensation factor.

The advantageous development of the quantizing device 507 particularly favorably exploits the fact that by virtue of the bit-reduced form of the quantizer, that is to say the merely three comparators 521, 522, 523 and amplifiers 515, 516, 517, it is also necessary only to keep available a 3-bit-wide feedback digital-to-analog converter 504 constructed in a favorable manner in respect of outlay.

The quantizing device 507 in accordance with the advantageous development permits the embodiment of a multibit delta-sigma converter which is particularly power-saving and favorable in respect of outlay and, by virtue of the excess loop delay compensation as represented as partial circuit arrangement 504, moreover enables a particularly large signal/noise ratio and supplies stable digital output signals having a high quality.

Although the present invention has been described above on the basis of a preferred exemplary embodiment, it is not restricted thereto but rather can be modified in diverse ways.

Thus, the invention shall not be restricted to a quantizing device having three comparators or a bit width of N=3. Rather, the idea according to the invention of tracking the switching thresholds or reference potentials of the individual comparators can, in the extreme case, also be implemented in just a single comparator whose switching threshold is in each case tracked to the level of the signal to be compared in such a way that the comparison result changes in each clock cycle.

The changeover between flash mode and follow-up mode may also be effected in a gradated manner. By keeping available many reference voltages, an increase in the bit width of the multibit delta-sigma converter according to the invention can be achieved in a simple manner by constricting the potential window in which the comparators operate and simultaneously increasing the number of digits in the thermometer code of the mean value signal. By way of example, it is possible to achieve a succession of flash operating mode and multibit modes or tracking modes with rising bit widths.

The filter may be embodied in time-continuous or time-discrete fashion, depending on the converter architecture of the corresponding multibit delta-sigma converter.

The provision of the reference potentials for the thermometer code need not, of course, be effected by means of a resistor ladder, but rather may be realized in diverse ways. Moreover, in a departure from the exemplary embodiment, the decoder can output a thermometer code instead of the binary code.

The invention enables particularly power-saving and high-resolution multibit delta-sigma converters. Reducing the number of comparators leads to a saving of area on a semiconductor chip. According to the invention, an increase in the bit width of a multibit delta-sigma converter does not lead to an exponential increase in the number of comparators required. Rather, the present invention can be applied to any desired bit widths. The changeover according to the invention between a run-up mode and the tracking mode means that a stable operating point of the multibit delta-sigma converter is always achieved and reliable functioning is ensured.

| List of reference symbols | |
|---|---|
| 1 | Multibit delta-sigma converter |
| 2 | Input |
| 3 | Output |
| 4 | Digital-to-analog converter |
| 5 | Summing device |
| 6 | Filter |
| 7 | Quantizing device |

| -continued | |
|---|---|
| List of reference symbols | |
| 8 | Comparison and switching device |
| 9 | Input |
| 10 | Output |
| 11 | Control input |
| 12 | Control logic |
| 13 | Buffer memory |
| 14-20 | Resistor |
| 21, 22, 23 | Comparator |
| 24, 25, 26 | Input |
| 27, 28, 29 | Input |
| 30, 31, 32 | Output |
| 33 | Decoder |
| 34 | Switching device |
| 35 | Differential amplifier |
| 107 | Quantizing device |
| 108 | Comparison device |
| 109 | Input |
| 110 | Output |
| 111 | Control input |
| 112 | Control logic |
| 113 | Buffer memory |
| 121, 122, 123 | Comparator |
| 124, 125, 126 | Input |
| 127, 128, 129 | Input |
| 130, 131, 132 | Output |
| 133 | Decoder |
| 200 | Multibit delta-sigma converter |
| 204 | Digital-to-analog converter |
| 207 | Quantizing device |
| 208 | Comparison device |
| 209 | Input |
| 210 | Output |
| 212 | Control logic |
| 221, 222, 223 | Comparator |
| 233 | Decoder |
| 234 | Switching device |
| 238 | Adding device |
| 239 | Up/down counter |
| 240 | Output |
| 241 | Controllable switch |
| 300 | Multibit delta-sigma converter |
| 304 | Digital-to-analog converter |
| 306 | Adder |
| 307 | Quantizing device |
| 308 | Comparison device |
| 309 | Input |
| 310 | Output |
| 311 | Control input |
| 312 | Control logic |
| 321, 322, 323 | Comparator |
| 333 | Decoder |
| 339 | Up/down counter |
| 340 | Output |
| 341 | Controllable switch |
| 342 | Reference digital-to-analog converter |
| 343 | Controllable switch |
| 400 | Multibit delta-sigma converter |
| 404 | Feedback digital-to-analog converter |
| 405 | Amplifier |
| 406 | Reference potential generating unit |
| 407 | Quantizing device |
| 408 | Adder |
| 409 | Adder |
| 410 | Input |
| 411 | Output |
| 438 | Adding device |
| 439 | Counter device |
| 440 | Output |
| 441 | Reference digital-to-analog converter |
| 504 | Feedback digital-to-analog converter |
| 501-506, 508 | Resistor |
| 507 | Quantizing device |
| 509 | Input |
| 510 | Output |
| 511 | Capacitor |
| 512 | Control logic |
| 513, 514 | Capacitor |

-continued

| List of reference symbols | |
|---|---|
| 515, 516, 517 | Amplifier |
| 518, 519, 520 | Controllable switch |
| 521, 522, 523 | Comparator |
| 524 | Coding logic |
| 525 | Switching controller |
| 526 | Switching device |
| 527-533 | Resistor |
| 534, 535 | Output |
| 536, 537 | Capacitor |
| 538 | Adding device |
| 539 | Counter device |
| 551 | Capacitor |
| A | Output |
| AD | Adder |
| DEK | Decoder |
| DV | Differential amplifier |
| E | Input |
| FBE | Amplifier |
| GND | Ground |
| K1-K7 | Comparator |
| KADW | Compensation analog-to-digital converter |
| L1-L7 | Input |
| M1-M7 | Input |
| MDSW | Multibit delta-sigma converter |
| O1-O7 | Output |
| P1-P7 | Comparison result |
| Q | Quantizer |
| R1-R7 | Resistor |
| S | Summer |
| SCD | Coding control signal |
| SCK | Switching signal |
| SCS | Control signal |
| SCT | Control signals |
| U0-U6 | Reference potential |
| U101-U103 | Reference potential |
| V1, V2, V3 | Comparison result |
| V201, V202, V203 | Comparison result |
| V301, V302, V303 | Comparison result |
| V401, V402, V403 | Comparison result |
| V501, V502, V503 | Comparison result |
| VREFP | Reference potential |
| VREFN | Reference potential |
| VREFN0 | Compensation reference potential |
| VREF0 | Compensation reference potential |
| VREFP0 | Compensation reference potential |
| UD | Step-up/down signal |
| PO | Potential offset |
| X | Mean value signal |
| XN, XM, XP | Line node |
| Z1 | Difference signal |
| Z2 | Filtered signal |
| Z3 | Feedback signal |
| Z4 | Signal subjected to application |
| Z6 | Digital thermometer code signal |
| ZA | Analog input signal |
| ZD | Digital output signal |
| ZK, ZK1, ZK2 | Compensation signal |

The invention claimed is:

1. A power-saving multibit delta-sigma converter comprising:
(a) an input for an analog input signal and an output for a digital output signal;
(b) a digital-to-analog converter having a bit width N and serving to convert the digital output signal to an analog feedback signal;
(c) a summing device for forming the difference between the input signal and the feedback signal;
(d) a filter for filtering the difference signal; and
(e) a clocked quantizing device for quantizing the filtered difference signal to form the digital output signal with the bit width N;
wherein the quantizing device having fewer than $2^N-1$ comparators which compare the filtered signal with a respective reference potential associated with the respective comparator and which each output a comparison result to a decoder, which generates the digital output signal from the comparison results, and the reference potentials being tracked in a manner dependent on a previous comparison result; and
wherein the quantizing device has at least one first, second and third comparator each having a first and a second input and an output, the filtered signal being applied to the first inputs, the outputs each supplying a comparison result and a first, second and third reference potential being switched to the second inputs, the second reference potential lying between the first and third reference potentials and being closest to the potential of the filtered signal.

2. The multibit delta-sigma converter as claimed in claim 1, wherein the summing device has a differential amplifier for amplifying the difference between the input signal and the feedback signal.

3. The multibit delta-sigma converter as claimed in claim 2, wherein the filter has an integrator for integrating the amplified difference signal.

4. The multibit delta-sigma converter as claimed in claim 1, wherein the quantizing device has a switching controller, which switches reference potentials to the comparators in a manner dependent on the previous comparison result, so that at least one of the comparators changes its comparison result in the event of a change in the input signal.

5. The multibit delta-sigma converter as claimed in claim 1, further comprising a memory for buffer-storing the digital output signal.

6. The multibit delta-sigma converter as claimed in claim 4, wherein the switching controller is coupled to the memory and switches the reference potentials to the comparators in a manner dependent on the buffer-stored output signal.

7. The multibit delta-sigma converter as claimed in claim 1, wherein the reference potentials are provided in equidistant fashion.

8. The multibit delta-sigma converter as claimed in claim 1, wherein $2^N-1$ different reference potentials can be switched.

9. A power-saving multibit delta-sigma converter comprising:
(a) an input for an analog input signal and an output for a digital output signal;
(b) a digital-to-analog converter having a bit width N and serving to convert the digital output signal to an analog feedback signal;
(c) a summing device for forming the difference between the input signal and the feedback signal;
(d) a filter for filtering the difference signal; and
(e) a clocked quantizing device for quantizing the filtered difference signal to form the digital output signal with the bit width N;
wherein the quantizing device applying a potential offset to the filtered signal and having fewer than $2^N-1$ comparators which compare the filtered signal to which said potential offset has been applied with a respective reference potential associated with the respective comparator and which each output a comparison result to a decoder, which generates the digital output signal from the comparison results, and the potential offset being tracked in a manner dependent on a previous comparison result; and
wherein the quantizing device has at least one first, second and third comparator each having a first and a second input and an output, the filtered signal being applied to the first inputs, the outputs each supplying a comparison result and a first, second and third reference potential being switched to the second inputs, the second reference potential lying between the first and third reference potentials and being closest to the potential of the filtered signal.

10. The multibit delta-sigma converter as claimed in claim 9, further comprising a switching controller, which is coupled to the to outputs of the comparators, and sets the potential offset in a manner dependent on the comparison results.

11. The multibit delta-sigma converter as claimed in claim 9, wherein the digital-to-analog converter and the quantizing device can be operated with the bit width N and with a bit width M=ln(Y+1)/ln(2) corresponding to a number Y of comparators.

12. The multibit delta-sigma converter as claimed in claim 11, characterized in that wherein the digital-to-analog converter and the quantizing device can be changed over between the two bit widths N and M.

13. The multibit delta-sigma converter as claimed in claim 10, wherein the switching controller has a counting device for generating a digital mean value signal in $2^N$–Y-digit thermometer code in a manner dependent on the comparison results.

14. The multibit delta-sigma converter as claimed in claim 13, wherein the counting device has an up/down counter.

15. The multibit delta-sigma converter as claimed in 9, wherein the decoder has an adding device for forming the N-bit-wide output signal by combining the comparison results with the mean value signal.

16. The multibit delta-sigma converter as claimed in claim 13. wherein the switching controller has a control logic which, in a manner dependent on the comparison results either switches the comparison results in Y-digit, M-bit-wide thermometer code as digital output signal or switches the comparison results combined with the mean value signal as digital output signal in $2^N$-digit, N-bit-wide thermometer code.

17. The multibit delta-sigma converter as claimed in claim 13, wherein the switching controller has a reference digital-to-analog converter for generating the offset potential from the digital mean value signal.

18. The multibit delta-sigma converter as claimed in claim 9, wherein the quantizing device
  has a compensation analog-to-digital converter for converting the comparison results into at least one analog compensation signal and
  has an adding device for subtracting the analog compensation signal from the filtered difference signal.

19. The multibit delta-sigma converter as claimed in claim 18, wherein the compensation analog-to-digital converter has a bit width that corresponds to the number of comparators.

20. The multibit delta-sigma converter as claimed in claim 18, further comprising an amplifier for amplifying the analog compensation signal with a compensation factor.

* * * * *